United States Patent
Hulick et al.

(10) Patent No.: US 8,511,633 B2
(45) Date of Patent: Aug. 20, 2013

(54) ACCESSORY ATTACHMENT MECHANISM

(75) Inventors: Troy Hulick, Saratoga, CA (US); Russell Zinner, Bend, OR (US)

(73) Assignee: Amazon Technologies, Inc., Reno, NV (US)

(*) Notice: Subject to any disclaimer, the term of this patent is extended or adjusted under 35 U.S.C. 154(b) by 407 days.

(21) Appl. No.: 12/418,387

(22) Filed: Apr. 3, 2009

(65) Prior Publication Data
US 2010/0181450 A1  Jul. 22, 2010

Related U.S. Application Data

(60) Provisional application No. 61/145,464, filed on Jan. 16, 2009.

(51) Int. Cl.
*A47B 91/00* (2006.01)

(52) U.S. Cl.
USPC .............................. 248/346.04; 248/346.03

(58) Field of Classification Search
USPC ............. 248/441.1, 444, 450, 451, 305, 306; 40/657, 757; 108/43, 44; 361/600, 679.01, 361/679.02, 679.3, 679.32, 679.41, 679.43, 361/679.08, 679.09, 679.27, 801, 802
See application file for complete search history.

(56) References Cited

U.S. PATENT DOCUMENTS

| | | | |
|---|---|---|---|
| 5,187,744 A * | 2/1993 | Richter | 379/449 |
| 5,465,191 A * | 11/1995 | Nomura et al. | 361/679.27 |
| 5,557,562 A | 9/1996 | Yoshiharu et al. | |
| 5,677,827 A | 10/1997 | Yoshioka et al. | |
| 5,788,202 A * | 8/1998 | Richter | 248/316.4 |
| 5,997,323 A * | 12/1999 | Youn | 439/159 |
| 6,029,940 A * | 2/2000 | Klein | 248/346.04 |
| 6,233,141 B1 | 5/2001 | Lee et al. | |
| 6,474,823 B1 | 11/2002 | Agata et al. | |
| 6,494,734 B1 | 12/2002 | Shuey | |
| 6,585,212 B2 * | 7/2003 | Carnevali | 248/346.07 |
| 6,817,587 B2 * | 11/2004 | Lin | 248/346.04 |
| 6,848,662 B2 | 2/2005 | Paramonoff et al. | |
| 7,164,578 B2 * | 1/2007 | Wang et al. | 361/679.08 |
| 7,515,409 B2 * | 4/2009 | Chien et al. | 361/679.41 |
| 7,551,458 B2 * | 6/2009 | Carnevali | 361/807 |
| 7,857,541 B2 * | 12/2010 | Gong | 403/322.3 |
| 2005/0047104 A1 * | 3/2005 | Grunow et al. | 361/801 |
| 2006/0138784 A1 * | 6/2006 | Wang et al. | 292/24 |

OTHER PUBLICATIONS

Non-Final Office Action for U.S. Appl. No. 12/815,904, mailed on Aug. 8, 2012, Amrinder Pal Singh Saini et al., "Low Profile Mechanical and Electrical Accessory Connector", 10 pages.

Chinese Office Action mailed Mar. 25, 2013 for Chinese patent application No. 201080004943.1, a counterpart foreign application of U.S. Appl. No. 12/418,387, 8 pages.

* cited by examiner

*Primary Examiner* — Alfred J Wujciak
(74) *Attorney, Agent, or Firm* — Lee & Hayes, PLLC

(57) ABSTRACT

A low profile accessory attachment mechanism suitable for attaching an accessory to an electronic device is disclosed. A straight hook and a curved hook are configured to mechanically engage slots in an electronic device, joining the accessory to the electronic device. By moving one of the hooks or altering the configuration of a slot, the accessory and electronic device may be separated. Additionally, the hooks may carry electrical current.

24 Claims, 13 Drawing Sheets

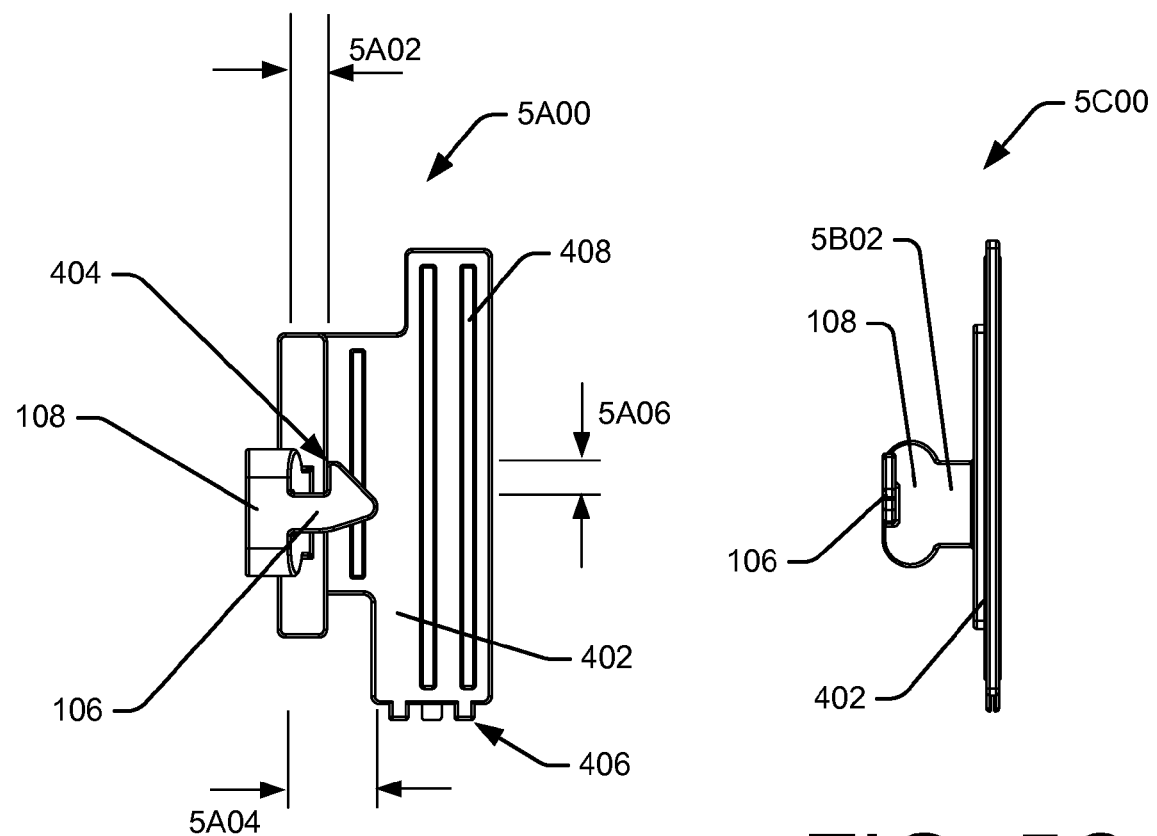
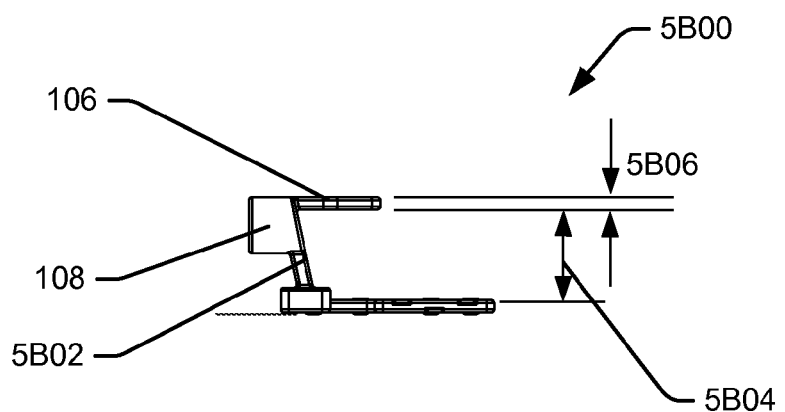

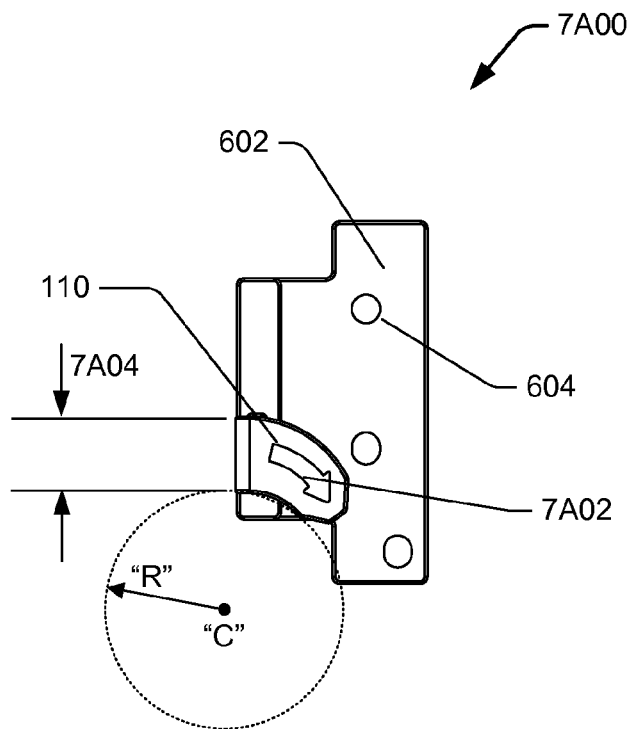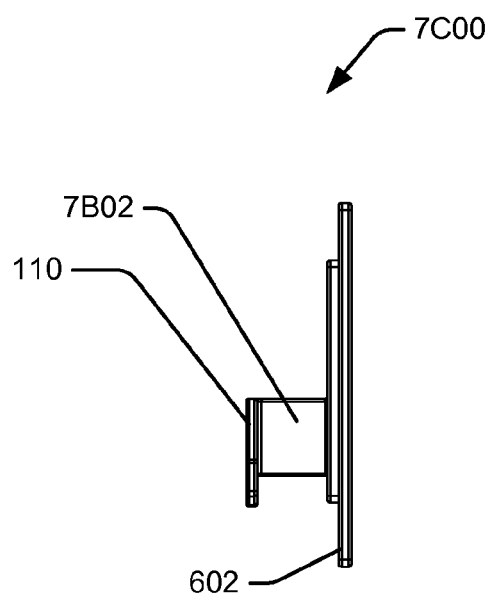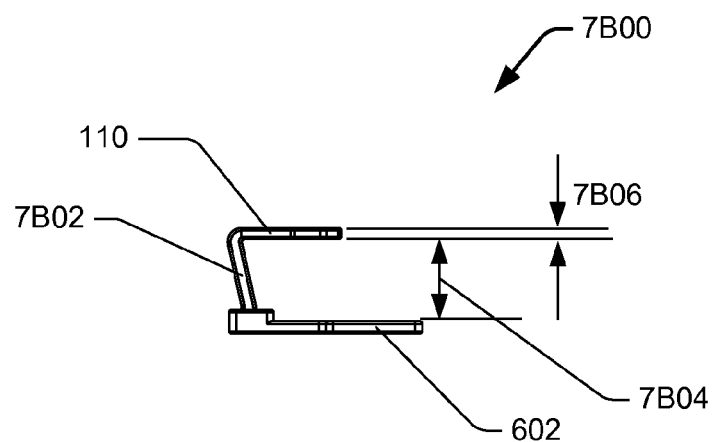

ACCESSORY ATTACHMENT MECHANISM

PRIORITY

This application claims the benefit of U.S. Provisional Application No. 61/145,464, filed Jan. 16, 2009, which is incorporated by reference herein.

BACKGROUND

Electronic devices such as electronic book readers ("e-book readers"), cellular telephones, personal digital assistant (PDA), portable media players, tablet computers, netbooks, and the like, may have accessories attached to them. One example accessory is a cover to provide protection for the device, as well as to enhance identification and aesthetics of the device.

Accessories may be attached to electronic devices in a variety of locations and using a variety of mechanisms. Factors that determine the location and method of attachment include the form factor of the device, placement of user interfaces such as buttons, placement of attachment ports, look and feel, and functionality of the device. For example, an electronic device may use buttons disposed around a perimeter of a device's case to accept user input. An electronic device may also have ports to connect to external peripherals or other electronic devices along the edges of the device.

Existing methods of attaching an accessory such as a cover to an electronic device may interfere with a user's ability to access buttons disposed around the perimeter of the device's case or obscure an attachment port along the edge. Furthermore, methods of attaching accessories to devices such as use of adhesives, sewing, etc., complicate assembly and render detachment of the cover from the electronic device impossible or impractical.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

FIG. 5A illustrates an overhead view of the first hook of FIG. 4.

FIG. 5B illustrates an end view of the first hook of FIG. 4.

FIG. 5C illustrates a side view of the first hook of FIG. 4.

FIG. 7A illustrates an overhead view of the second hook of FIG. 6.

FIG. 7B illustrates an end view of the second hook of FIG. 6.

FIG. 7C illustrates a side view of the second hook of FIG. 6.

DETAILED DESCRIPTION

Overview

As described above, an accessory may be attached to an electronic device such as an e-book reader, cellular telephone, personal digital assistant (PDA), portable media player, tablet computer, netbook, etc. In one example, the accessory may be a cover that protects, aids in identification, and/or improves the aesthetics of the electronic device. Other accessories may include a reading light, power source, docking station, additional storage, security chain to prevent theft, stand, surface mount, etc. An attachment mechanism removably couples the accessory to the electronic device.

Disclosed is a low profile attachment mechanism. This attachment mechanism provides positive engagement between the electronic device and the accessory, while permitting tool-free attachment and detachment of the accessory. In the case where the accessory is a cover, the attachment mechanism also allows attachment of the cover that permits the cover to open flat or be folded under the electronic device, and minimizes interference with perimeter mounted buttons or ports on the edge of the electronic device adjacent to a fold in the cover.

In one implementation, the attachment mechanism comprises a first hook (or latch arm) and a second hook (or latch arm) engaged to a base. The electronic device includes engagement features, such as a slot or slots, which are complimentary to the hooks. There may be multiple engagement features in the electronic device, such as two or more engagement slots, or a single engagement feature such as a slot or channel.

In one specific implementation, the first hook may be moveably engaged to one portion of the base, with a spring disposed in the base maintaining the first hook in a normally latched, or engaged, condition. The second hook in this implementation is fixedly engaged to a portion of the base distal to the first hook, and is curved. More than two hooks may also be used.

In some implementations, the attachment mechanism may also provide for an electrical connection. For example, a hook may carry electrical current for power or signaling. The hook may be a single conductor, providing a single current path, or may contain a plurality of conductors insulated from one another. For example, a top conductive layer may be separated from a bottom conductive layer by an insulator, forming two conductive pathways. Alternately, a non-conductive hook, or a hook coated with an insulator, may have a plurality of conductive traces disposed along it.

Attachment of an Electronic Device to an Accessory

Figure 1:
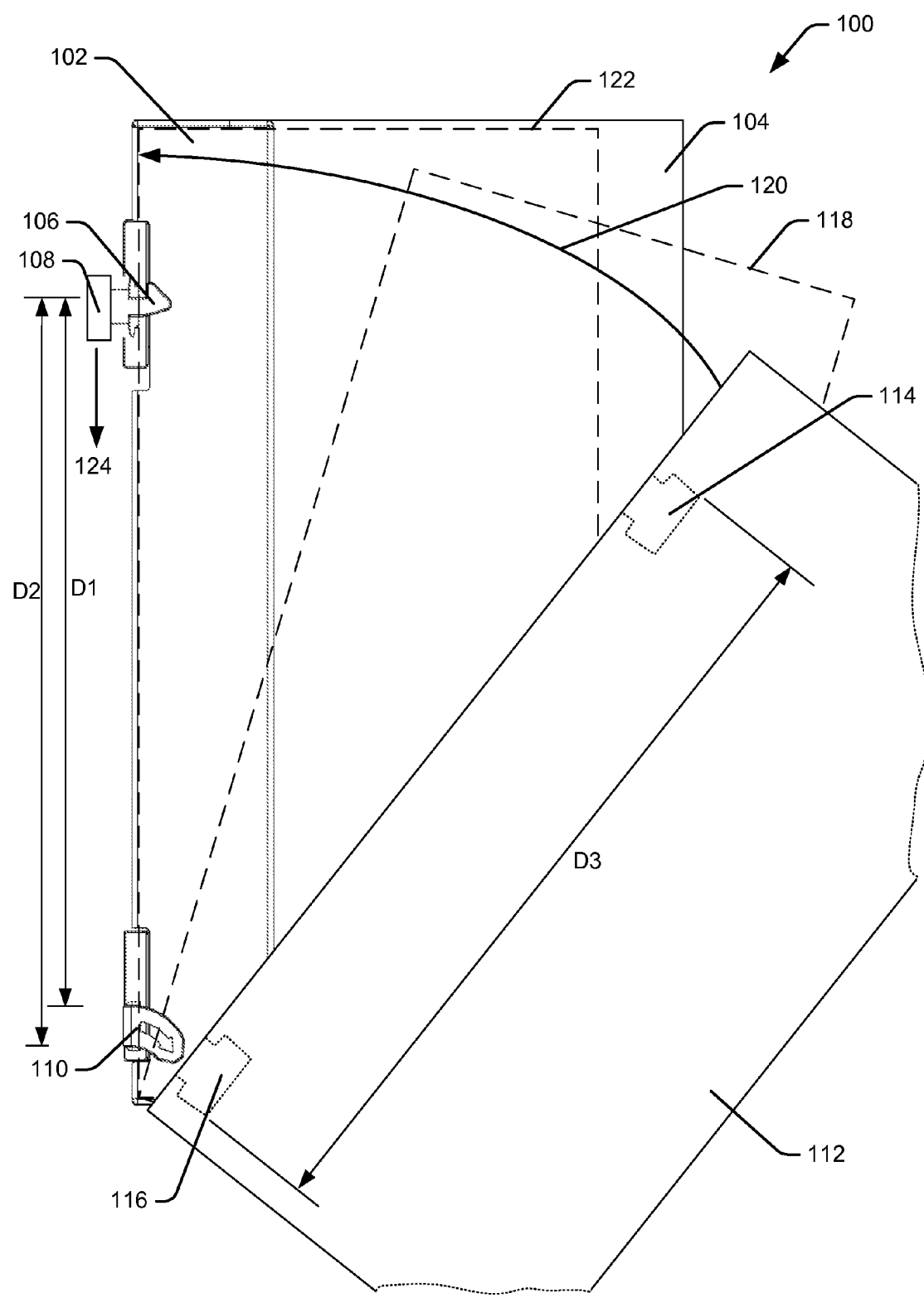
FIG. 1 is a schematic view showing a progressive engagement of an illustrative accessory having an accessory mount with an electronic device.

FIG. 1 is a schematic view showing a progressive engagement of an illustrative accessory 104 having an accessory mount 100 with an electronic device 112. The accessory 104, such as a cover, may be attached to the electronic device 112 using the accessory mount 100. In this example, the accessory mount 100 comprises a body 102, a first hook 106, and a second hook 110. The body 102 may be substantially flat, having a low-profile. The first hook 106 is movably engaged with the body 102 and includes a button 108 for actuation by a user. The second hook 110 is fixedly engaged to body 102 at a distance "D1" along the body 102 from the first hook 106. Distance "D1" extends from a top edge of the first hook to a top edge of the second hook. Distance "D2" extends between outermost edges of the first hook and the second hook.

The electronic device 112 comprises a first slot 114 defining an interior engagement space and a second slot 116 defining an interior engagement space. The first slot 114 and second slot 116 are complimentary to and configured to mechanically engage, the first hook 106 and second hook 110, respectively. "D1" may be any distance suitable to couple to the slots 114, 116, or other engagement features on the electronic device. In the illustrated electronic device 112, distance "D1" may be at least about 90 millimeters (mm) and at most about 150 mm. In another example, D1 may be between about 91 mm and about 105 mm. In yet another example, D1 may be between about 91 mm and about 99 mm. "D2" may be at least about 90 mm and at most about 165 mm. "D3" shows the distance between outermost edges of the interior engagement space of first slot 114 and the interior engagement space of second slot 116 within electronic device 112. Distance "D3" may be between at least about 90 and at most about 165 mm. Of course, in other implementations, D1 and D3 may be longer or shorter distances.

The configuration shown in FIG. 1 makes attachment of accessories simple and non-obstructive. Broken lines 118 indicate the outline of electronic device 112 during attachment. Broken lines 122 indicate the outline of the electronic device 112 after attachment. Attachment begins as shown with placement of second hook 110 of the accessory mount 100 into second slot 116 of the electronic device 112. Then, the electronic device 112 is moved in a direction indicated by arrow 120 towards first hook 106, generally along an arc proximate to the second hook 110. When in an attached configuration (shown in broken lines at 122), the first hook 106 engages first slot 114 of the electronic device 112, while second hook 110 engages second slot 116.

Detachment occurs in the reverse order, with the user moving first hook 106 along direction 124 (in this example towards second hook 110) by pressing button 108, thereby disengaging the first hook 106. Once the first hook 106 is disengaged, the user pivots the electronic device 112 away from first hook 106, and disengages the accessory mount 100 from the second hook 110.

Figure 2:
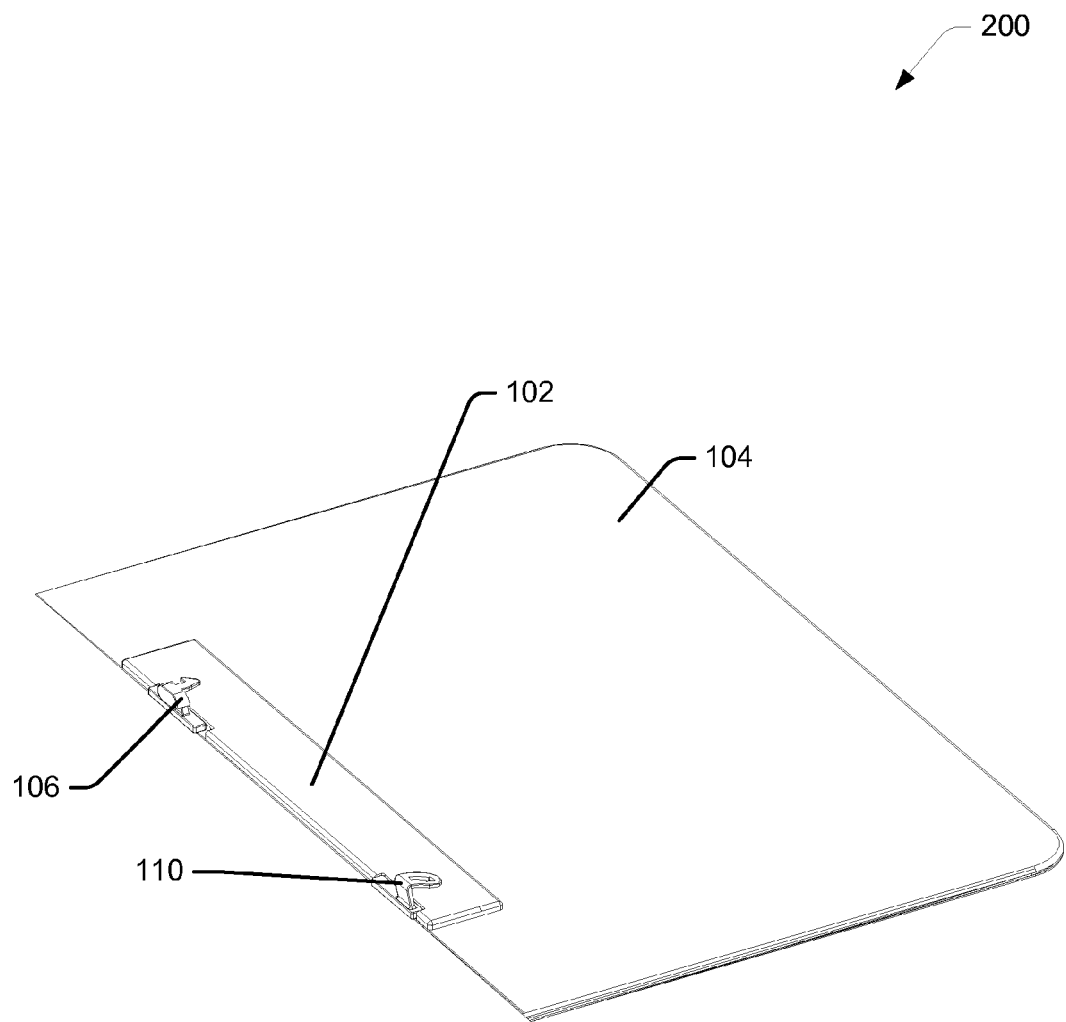
FIG. 2 shows a perspective view of the accessory mount of FIG. 1.

FIG. 2 shows a perspective view 200 of the accessory mount of FIG. 1 without the electronic device 112.

Figure 3:
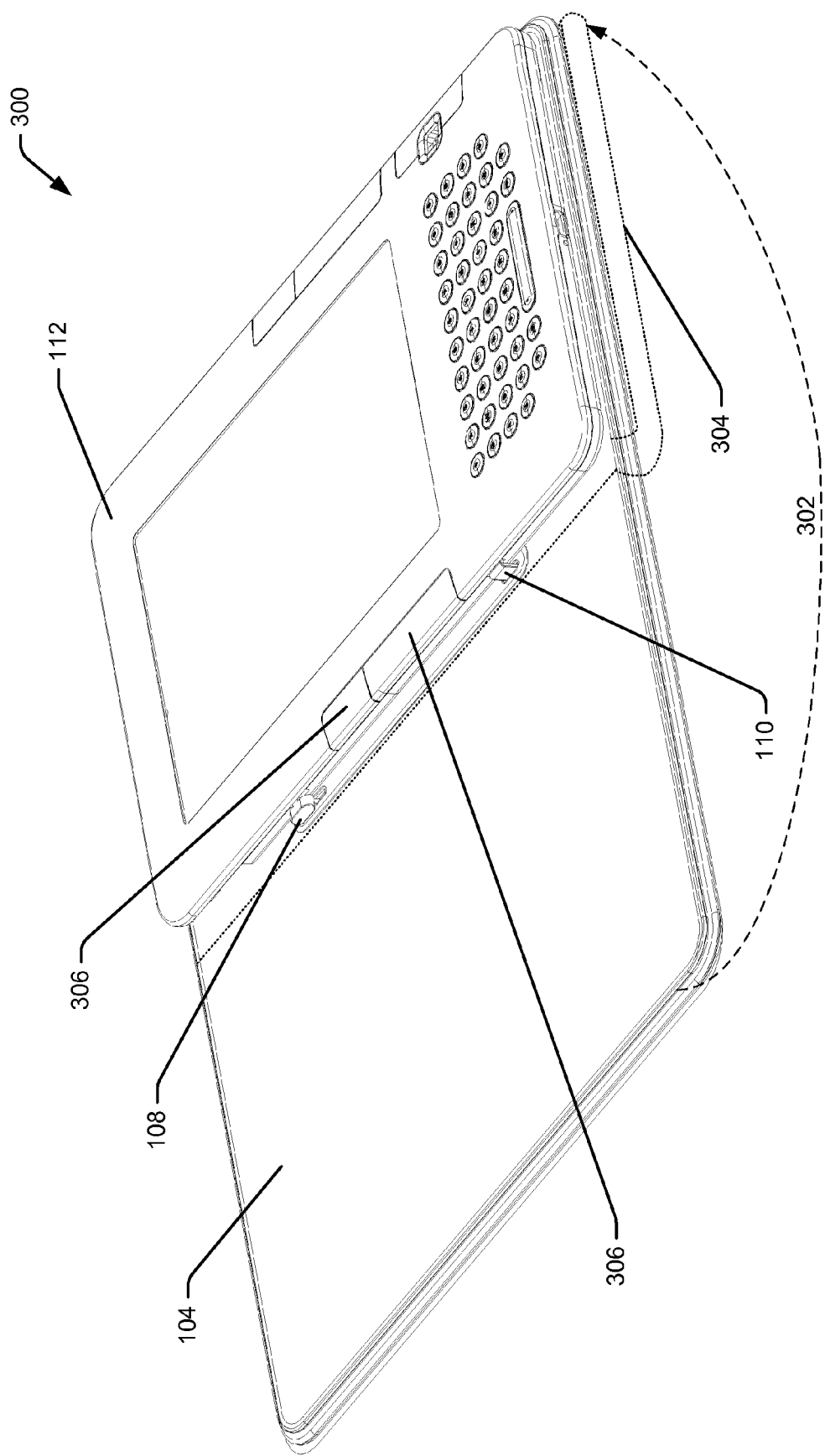
FIG. 3 shows the accessory mount of FIG. 1 engaging an illustrative cover to an e-book reader.

FIG. 3 shows a perspective view 300 of the accessory mount of FIG. 1 engaging an illustrative cover accessory 104 to an e-book reader electronic device 112, with the cover accessory 104 in a flat open configuration. Folding a front cover of the cover accessory 104 along arrow 302 places the cover accessory 104 into a folded open configuration. Broken lines 304 show the cover accessory 104 in a folded open configuration, with the cover folded under the electronic device. As described above, in the folded open configuration, a user has unobstructed access to edge mounted buttons 306 disposed along the perimeter of the device which is adjacent to the edge mounted engagement features.

Figure 4:
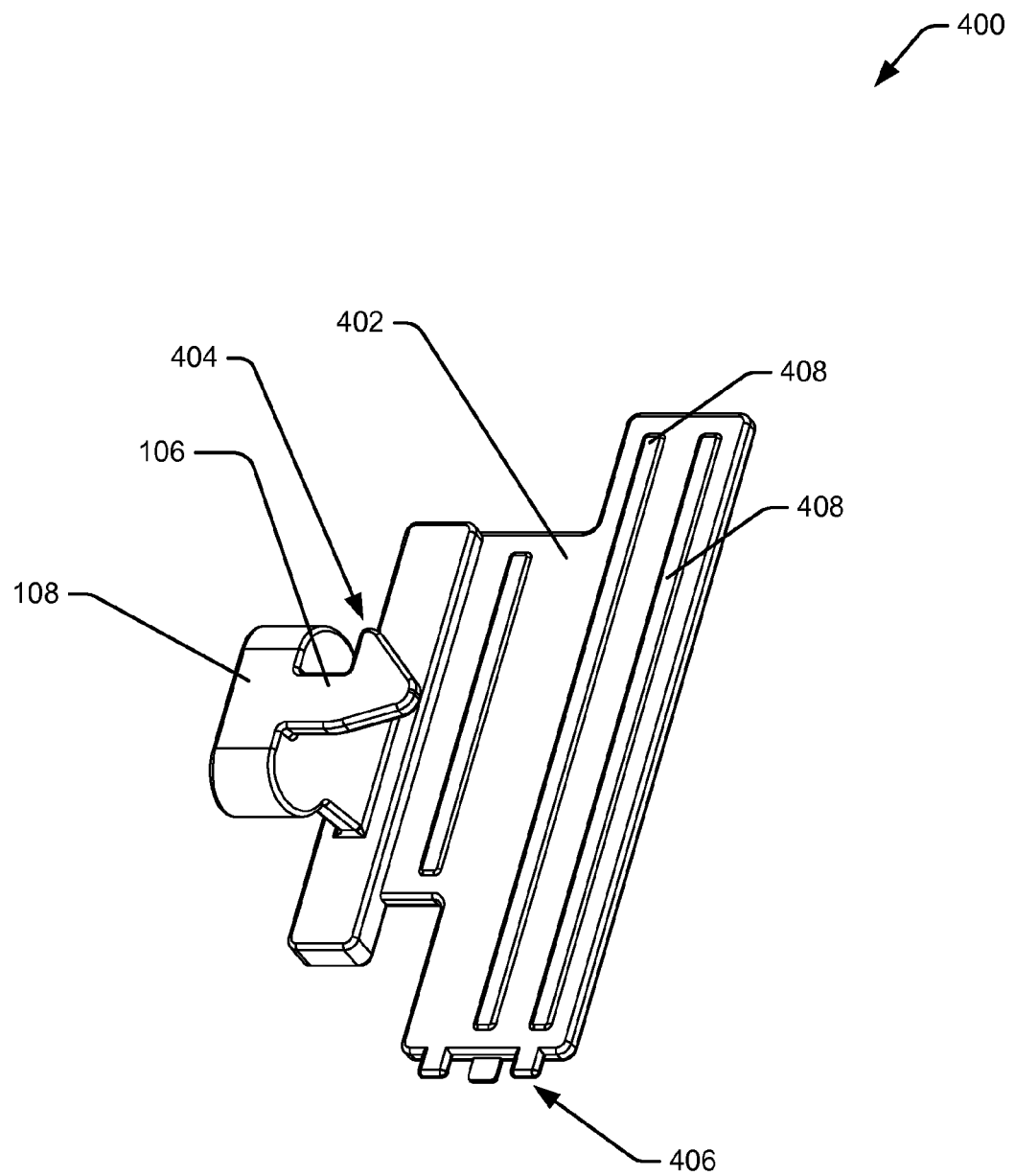
FIG. 4 illustrates a perspective view of a first hook of the accessory mount of FIG. 1.

FIG. 4 illustrates a perspective view 400 of the first hook 106 of the accessory mount of FIG. 1. The first hook 106 further comprises a first hook body 402. The first hook body 402 has a button 108 for a user to manipulate the first hook 106. This button 108 may be an extension of the first hook body 402, or a separate piece affixed to the first hook body 402. Extending from the first hook body 402 is a first hook 106 having a first hook barb 404, configured to engage a complimentary first slot 114 in the electronic device 112. First hook body 402 may have a spring engagement feature 406. The spring engagement feature 406 engages a spring to bias the first hook 106 to a latched position when the user is not applying pressure to button 108. First hook body 402 may have one or more ribs 408 to stiffen the first hook body 402, or moveably engage matching features in the body 102, or both.

FIG. 5A illustrates an overhead view 5A00 of the first hook 106 of FIG. 4. A distance 5A02 from an interior edge of button 108 along first hook 106 to an interior edge of first hook barb 404 is about 2.16 mm. A distance 5A04 from the interior edge of button 108 to the end of first hook 106 is about 5.36 mm. A distance 5A06, which is substantially perpendicular to distance 5A02, extends from an edge of a shaft of first hook 106 to a tip of first hook barb 404 about 1.5 mm. The shaft of first hook 106, before widening to form the first hook barb 404, is about 2.46 mm wide.

FIG. 5B illustrates an end view 5B00 of the first hook of FIG. 4. A first hook vertical member 5B02 is visible extending between the first hook body 402 and the first hook 106. A standoff distance 5B04 is defined by the thickness of the electronic device 112 and placement of the slots 114, 116 or other engagement feature on the electronic device 112. In this illustration, the standoff distance 5B04 is about 3.7 mm. This view also illustrates first hook barb 404 and first hook 106 lying substantially in a plane parallel to a plane of the first hook body 402. The thickness of the first hook 106 shown at 5B06 is about 0.8 mm.

FIG. 5C illustrates a side view 5C00 of the first hook 106 of FIG. 4.

Figure 6:
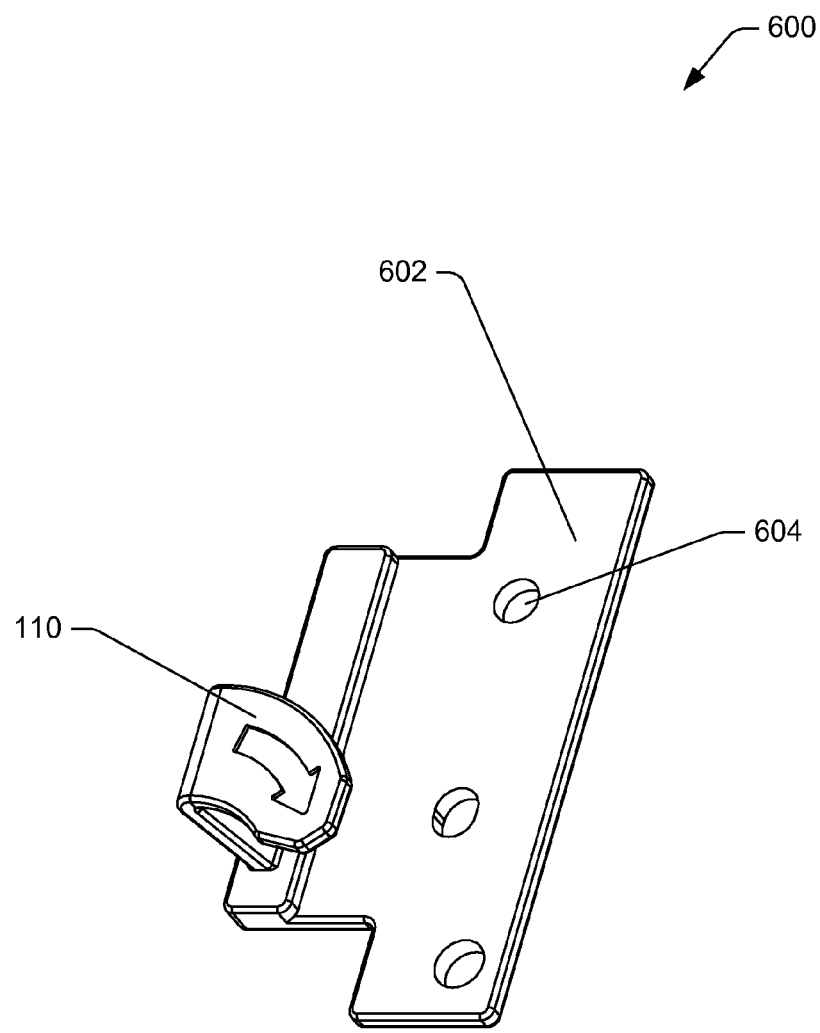
FIG. 6 illustrates a perspective view of a second hook of the accessory mount of FIG. 1.

FIG. 6 illustrates a perspective view 600 of the second hook 110 of the accessory mount 100 of FIG. 1. The second hook 110 may have a second hook body 602 with mounting holes 604 for attachment with a slot or other engagement feature of the accessory 104.

FIG. 7A illustrates an overhead view of the second hook of FIG. 6. A visual indicator 7A02 may be provided on second hook 110. This visual indicator 7A02 facilitates attachment of the electronic device to the accessory by providing guidance to the user. The visual indicator may be cut out as shown in this illustration, painted, etched, embossed, or otherwise rendered onto the surface. FIG. 7A also illustrates a curvature of the second hook 110 having a radius "R" relative to center "C", with the distal end of second hook 110 pointing substantially away from the first hook 106. In one illustrative embodiment, "R" may be about 4.85 mm. The arc of the curve described by the second hook 110 may be at least about 3 mm and at most about 8 mm in length. In this example, the width 7A04 of the second hook 110 is about 5.1 mm.

FIG. 7B illustrates an end view of the second hook 110 of FIG. 6. A second hook vertical member 7B02 is visible extending between the second hook body 602 and the second hook 110. A standoff distance 7B04 is defined by the thickness of the electronic device 112 and placement of the slots 114, 116, or other engagement feature on the electronic device 112. In this illustration, the standoff distance 7B04 is about 3.7 mm. This view also illustrates second hook 110 lying substantially in a plane parallel to a plane of the second hook body 602. The thickness of the second hook 110 shown at 7B06 is about 0.8 mm.

FIG. 7C illustrates a side view of the second hook of FIG. 6.

Figure 8:
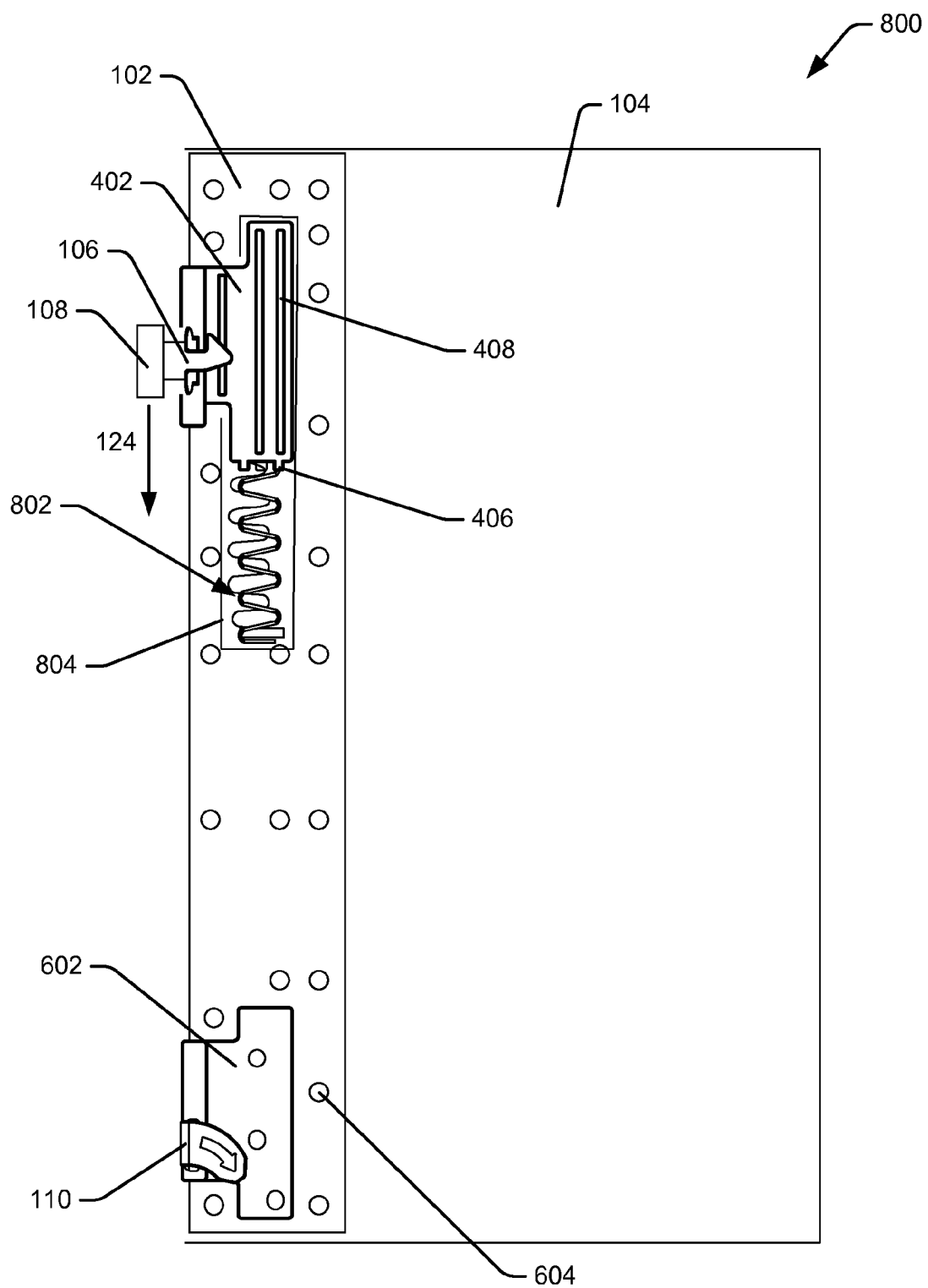
FIG. 8 illustrates a front view of the accessory mount of FIG. 1, showing arrangement of the first and second hooks and a spring mechanism.

FIG. 8 illustrates a front view of the accessory mount 100 of FIG. 1, showing an internal arrangement of the first and second hooks and a spring mechanism. The first hook 106 attaches to first hook body 402. First hook body 402 is shown engaged via spring engagement feature 406 to spring 802. Spring 802 may be a compression spring. Spring 802 may be formed from music wire, flat stock, foam, plastic, or other resilient material. In another implementation, a plurality of magnetic members, detent mechanisms, cam mechanisms, or interference features, may replace spring 802.

Guide features 804 may be disposed about first hook body 402 to constrain the movement of first hook body 402 to a pre-defined area. Alternatively, guide features including a channel or rib may be present in the body 102 and engage rib 408 on first clip body 402.

In this illustration, spring 802 is a compression spring having a proximate end engaged by the spring engagement feature 406 on the first hook body 402 and having a distal end in contact with a guide member 804. Upon application of force by a user on button 108 in direction 124, the first hook 106 and attached first hook body 402 compresses spring 802 and disengages first hook 106 from first slot 114 in electronic device 112. For example, a first hook may be fixedly attached to body 102, while a second hook 110 is moveably engaged to body 102 with a spring to bias the second hook 110 to a latched position when the user is not applying pressure to the second hook 110.

In the illustration of FIG. 8, disengagement motion direction 124 is towards second hook 110. However, in other examples, direction 124 may also be away from second hook 110, or another direction as defined by the mechanism to disengage the first hook barb 404 or other engagement feature from the first slot 114 in electronic device 112.

Figure 9:
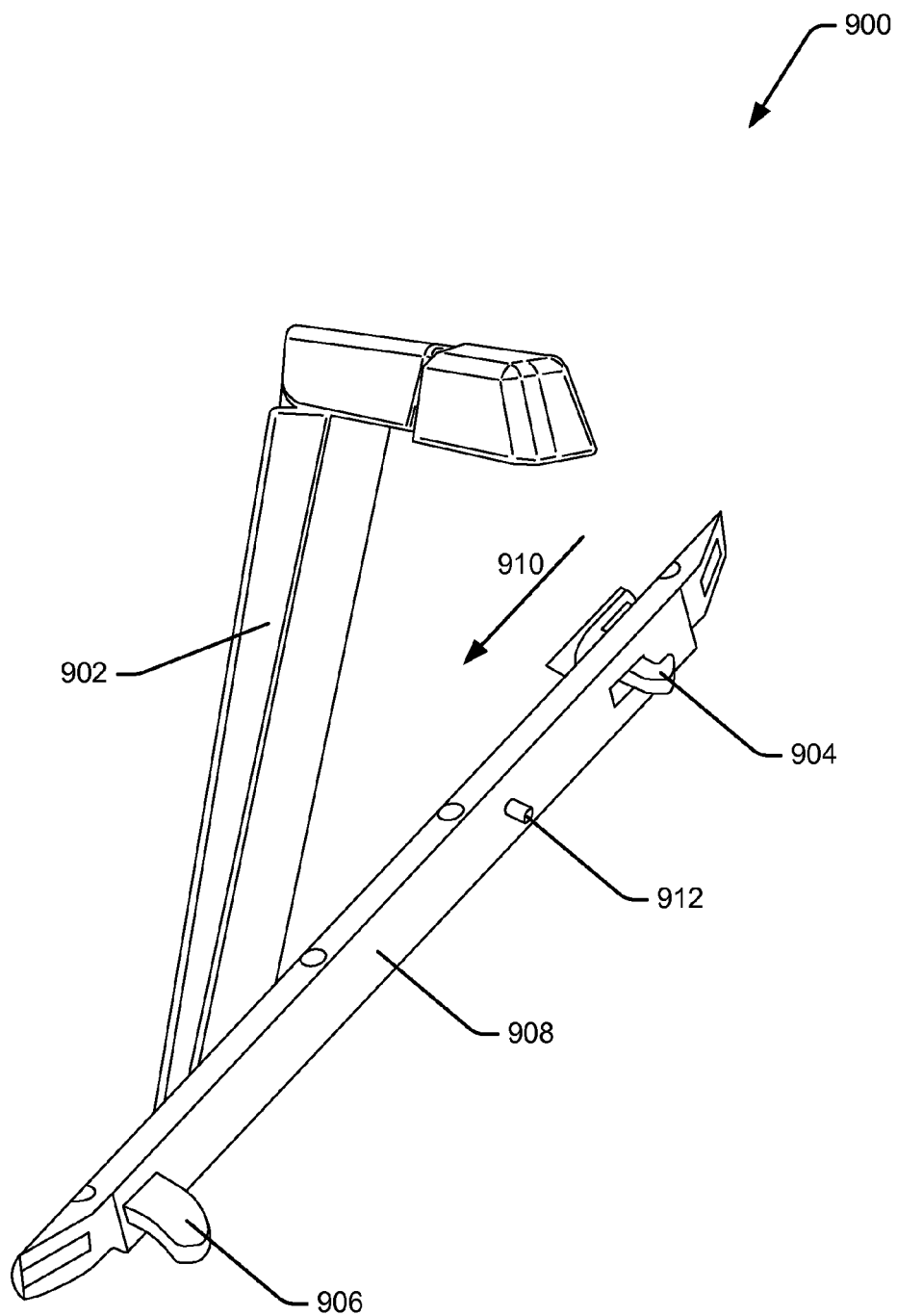
FIG. 9 illustrates another implementation of an accessory mount, in which the hooks protrude substantially orthogonally from the body of the accessory mount.

FIG. 9 illustrates another implementation of an accessory mount 900 with an attached reading light 902. In this implementation, a first hook 904 and a curved second hook 906 protrude substantially orthogonally from the body 908 of the accessory mount. The first hook 904 may move along direction 910 towards curved second hook 906 to disengage the accessory mount 900 from the electronic device 112. An additional engagement feature 912, located between first hook 904 and curved second hook 906, may protrude substantially orthogonally from the body 908. Additional engagement feature 912 may provide additional structural strength to the engagement between the accessory mount 900 and the electronic device 112.

Figure 10A:
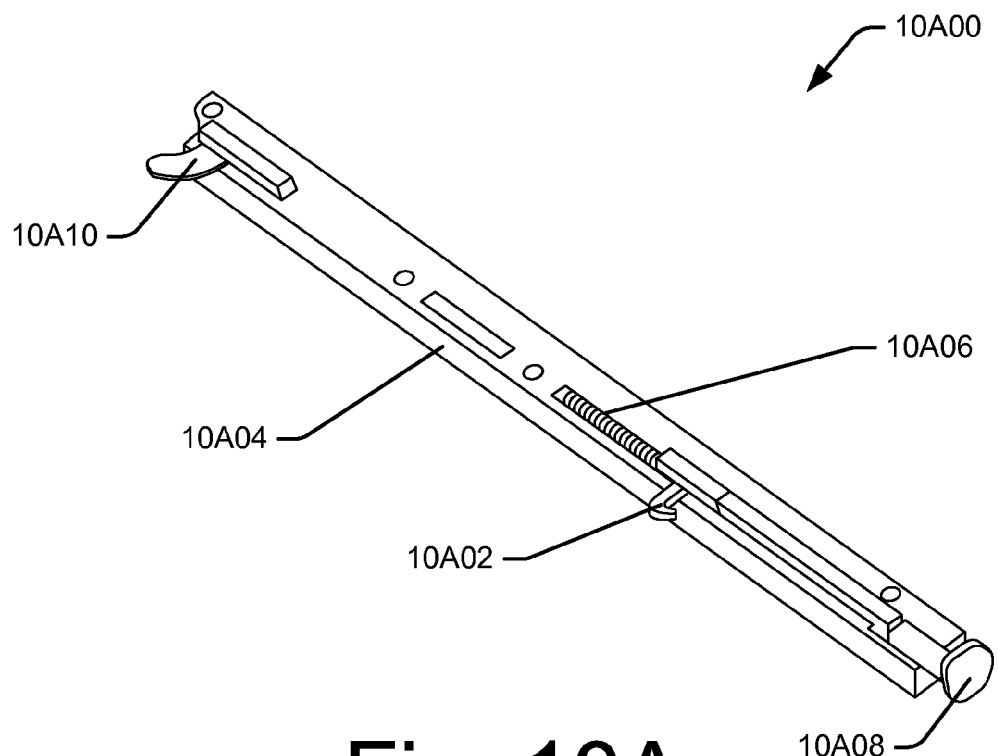
FIG. 10A illustrates another implementation of an accessory mount, in which a compression spring maintains engagement of a moveable hook.

FIG. 10A illustrates another implementation of an accessory mount 10A00. A first hook 10A02 is moveably engaged with body 10A04. A compression spring 10A06 engages first hook 10A02 and body 10A04 to maintain first hook 10A02 in an engaged configuration until pressure is exerted on button 10A08 which is fixedly engaged with first hook 10A02. A second curved hook 10A10 is fixedly engaged to body 10A04 distal from first hook 10A02. In contrast to the accessory mount 100 of FIG. 1, accessory mount 10A00 does not have a vertical standoff member, thus the first hook 10A08 and second hook 10A10 are in-line with the body 10A04. Also, accessory mount 10A00 provides for a pushbutton to disengage the accessory cover instead of a sliding button 108 on accessory mount 100.

Figure 10B:
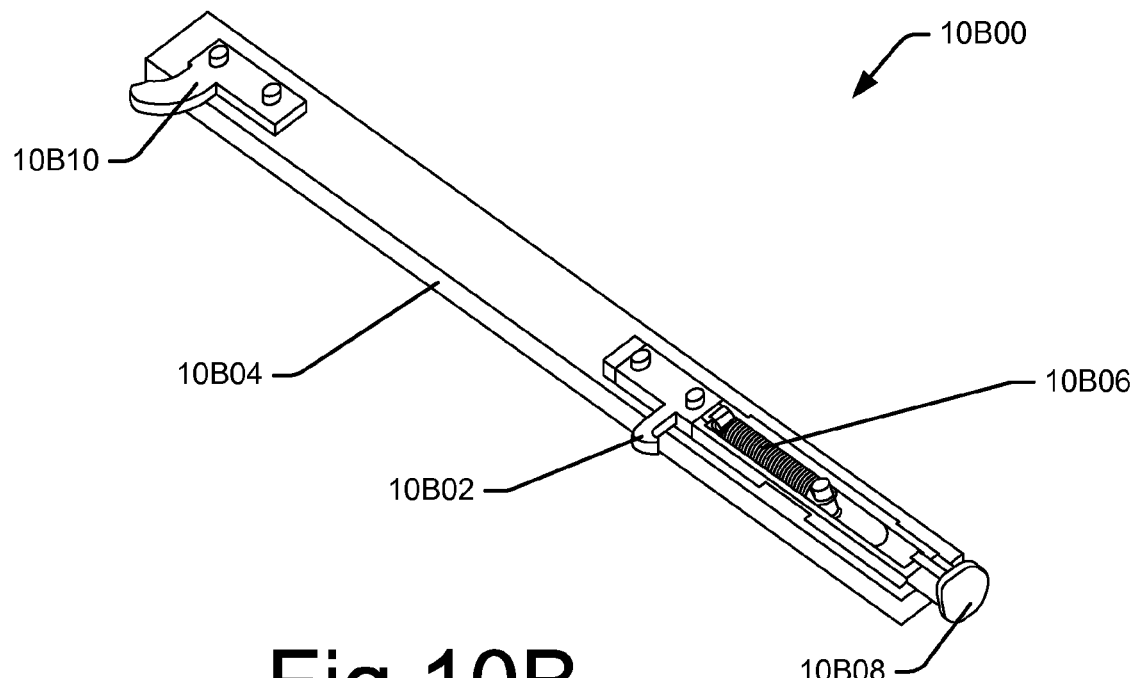
FIG. 10B illustrates another implementation of an accessory mount, in which an extension spring maintains engagement of a moveable hook.

FIG. 10B illustrates another implementation of an accessory mount 10B00. A first hook 10B02 is moveably engaged with body 10B04. An extension spring 10B06 engages first hook 10B02 and body 10B04 to maintain first hook 10B02 in an engaged configuration until pressure is exerted on button 10B08 which is fixedly engaged with first hook 10B02. A second curved hook 10B10 is fixedly engaged to body 10B04 distal from first hook 10B02. In contrast to accessory mount 10A00 of FIG. 10A, accessory mount 10B00 uses an extension spring.

Figure 11:
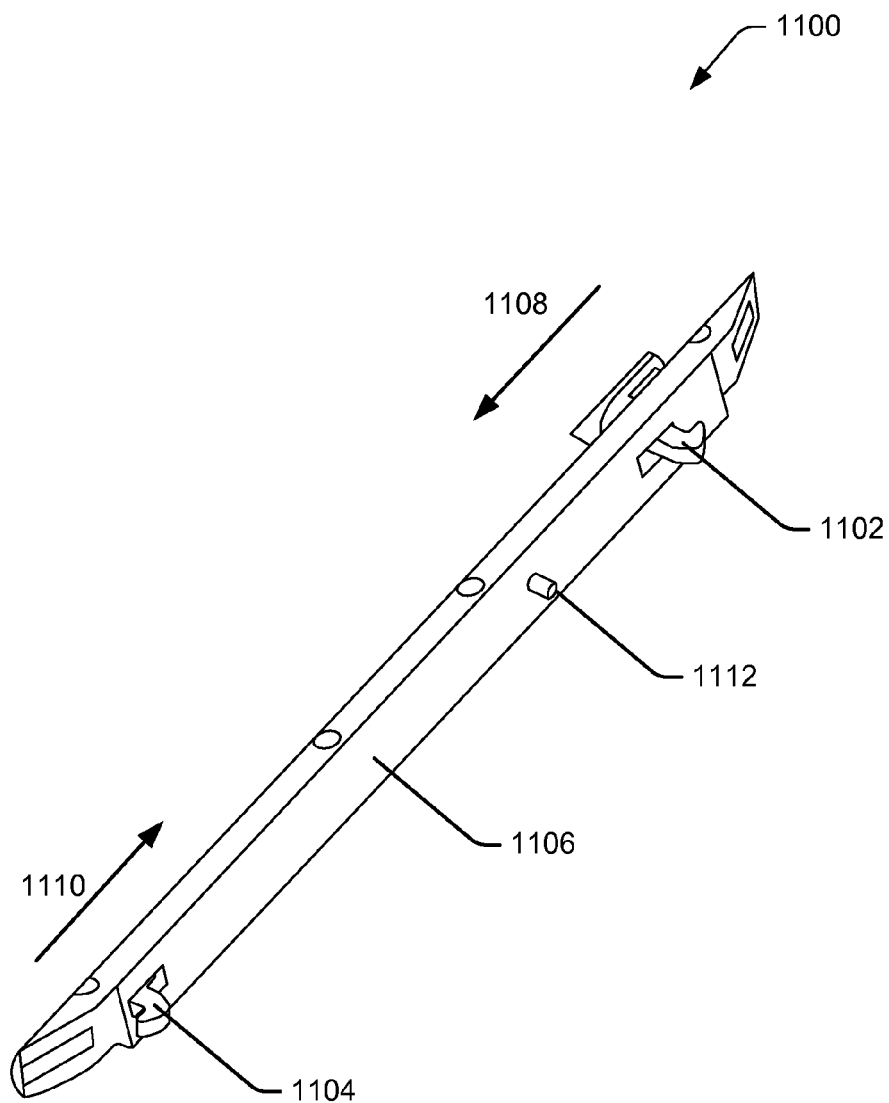
FIG. 11 illustrates another implementation of an accessory mount, in which two hooks are moveably engaged to the body of the accessory mount.

FIG. 11 illustrates another implementation 1100 of an accessory mount. A first hook 1102 and a second hook 1104 are moveably engaged with body 1106, and protrude from body 1106. First hook 1102 is moveable substantially towards second hook 1104 along direction 1108. Second hook 1104 is moveable substantially towards first hook 1102 along direction 1110. First hook 1102 and second hook 1104 may move independently of, or simultaneously with, one another. Disengagement of an electronic device 112 from accessory mount 1100 is effected by moving one or both hooks substantially toward one another, thus disengaging the hooks from complimentary slots in electronic device 112, and separating the accessory mount 1100 and the electronic device 112.

In some implementation, an additional engagement feature 1112, located between first hook 1102 and second hook 1104, may protrude substantially orthogonally from the body 1106. Additional engagement feature 1112 may provide additional structural strength to the engagement between the accessory mount 1100 and the electronic device 112.

Figure 12:
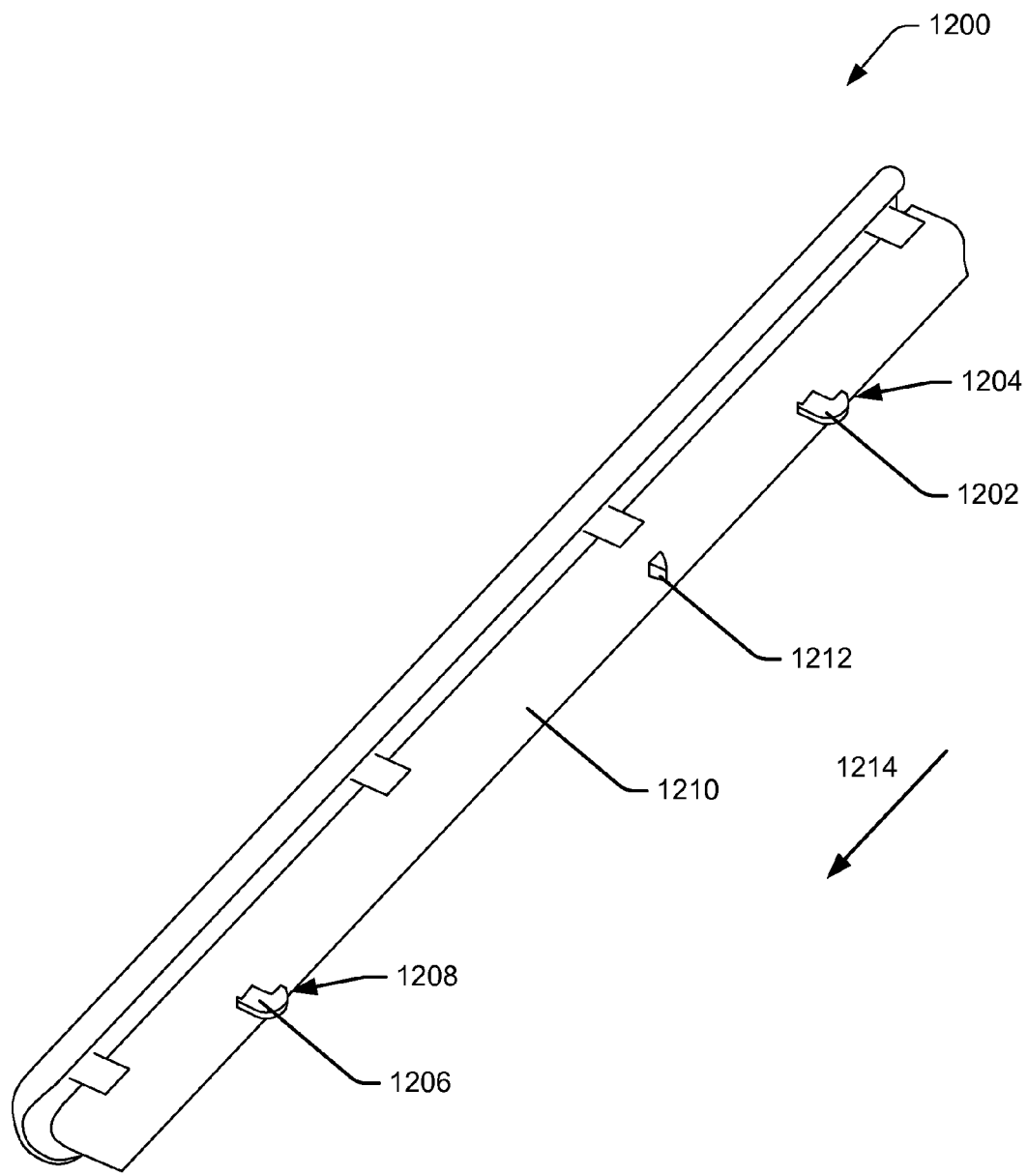
FIG. 12 illustrates another implementation of an accessory mount, in which both hooks are fixedly engaged to the body of the accessory mount, and a moveable latch extends from the body to engage a hole on the electronic device.

FIG. 12 illustrates another implementation of an accessory mount 1200. A first hook 1202 having a first hook barb 1204 and a second hook 1206 having a second hook barb 1208 are fixedly mounted to a body 1210 of the accessory mount. First hook 1202 and second hook 1206 are oriented with their respective barbs 1204 and 1208 pointing in substantially the same direction. A latch 1212 extends from the body 1210 to engage a hole or recess present on the electronic device 112. Attachment is accomplished by placing first hook 1202 and second hook 1206 within complimentary slots or other engagement features present on the electronic device 112. Electronic device 112 is then slid along a direction indicated by arrow 1214 until the first hook 1202 and second hook 1206 engage their respective slots, and latch 1212 engages a complimentary hole or recess in the electronic device 112. The accessory mount 1200 and electronic device 112 may be disengaged by disengaging latch 1212 and sliding the electronic device 112 in the direction opposite that shown by direction arrow 1214.

Figure 13:
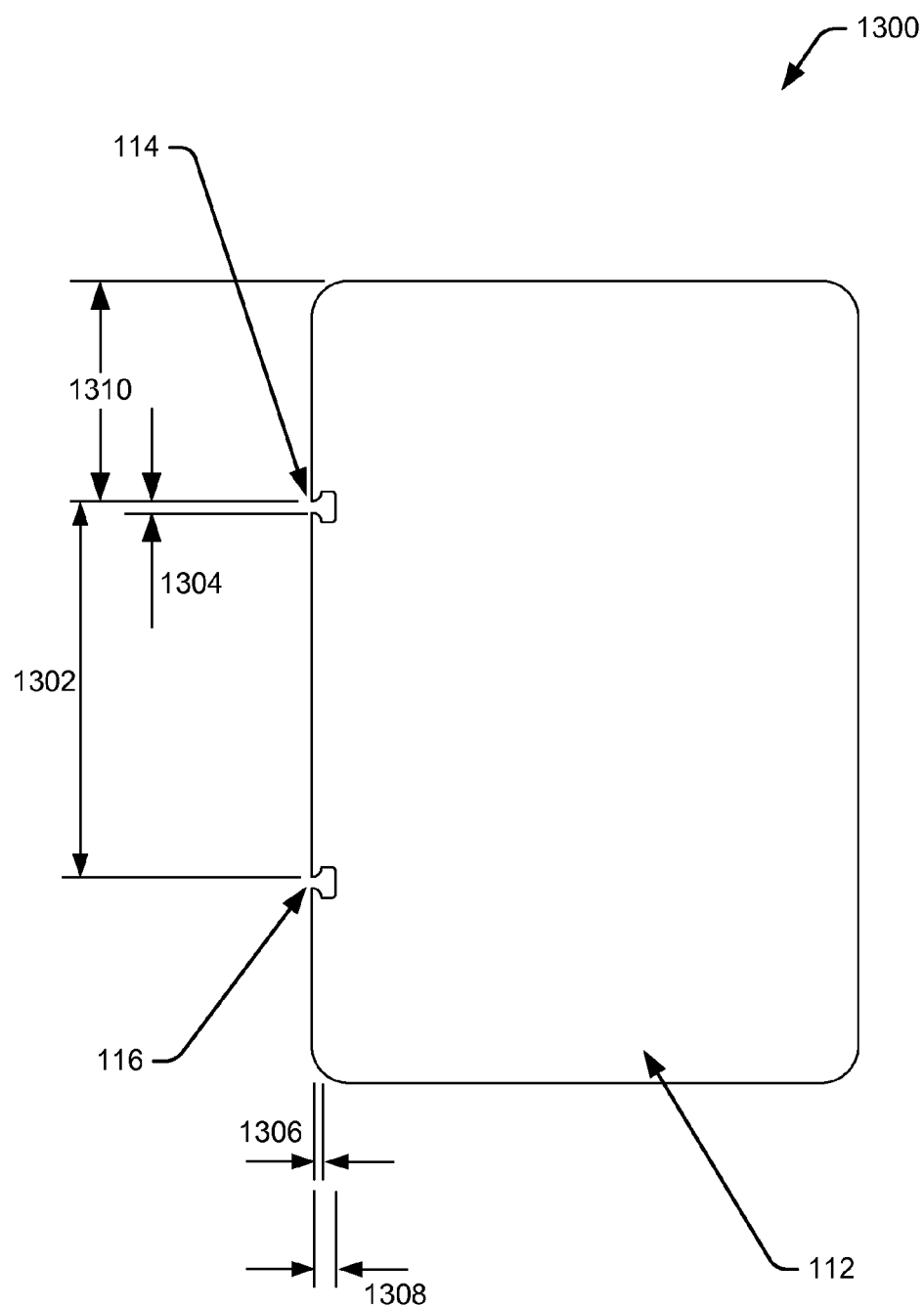
FIG. 13 illustrates dimensions of one implementation of an electronic device configured to use the accessory mount of FIG. 1.

FIG. 13 illustrates the dimensions of one specific embodiment of an electronic device 1300 configured to use the accessory mount of FIG. 1. At 1302 the distance from a first slot entry edge to a second slot entry edge is about 93.6 mm. Each slot entry 1304 is about 5.7 mm wide. Each slot entry extends 1306 about 2.4 mm into the device before opening into an interior engagement space. The distance 1308 from an outer perimeter of the electronic device 1300's case to the innermost point of the interior engagement space is about 6.9 mm. The distance from the vertex within the corner proximate to the first slot entry to the closest first slot entry edge is about 56 mm 1310. Other embodiments of electronic devices may have larger or small dimensions.

The base, hooks, spring, and other components may be made by stamping, milling, molding, forming, or other methods of fabrication suitable to the material chosen, such as metals, plastics, or composites.

Conclusion

Although the subject matter has been described in language specific to structural features and/or methodological acts, it is to be understood that the subject matter defined in the appended claims is not necessarily limited to the specific features, dimensions, or acts described. Rather, the specific features, dimensions, and acts are disclosed as illustrative forms of implementing the claims. Moreover, any of the features of any of the devices described herein may be implemented in a variety of materials or similar configurations.

What is claimed is:

1. An accessory mount for an electronic book reader device comprising:
   a base;
   a first hook configured to engage a first slot in an electronic book reader device, the first hook comprising a substantially planar engagement member having a barb and being moveably engaged to the base;
   a spring configured to bias the first hook in a latched configuration; and
   a second hook configured to engage a second slot in the electronic book reader device, the second hook comprising an engagement member having a curve describing an arc in a single plane with a distal end pointing substantially away from the first hook, the second hook being fixed to the base such that second hook is substantially immovable with respect to the base during an engaging of the accessory mount to the electronic book reader device, the base having three dimensions and the single plane being defined by two longest dimensions of the base;
   wherein the first hook is moveably engaged to the base such that the first hook is moveable independently from the second hook.

2. The accessory mount of claim 1, wherein a distance between outermost edges of the first hook and the second hook comprises at least 90 mm and at most about 150 mm.

3. The accessory mount of claim 2, wherein the first hook comprises a substantially planar shaft, and the second hook comprises a substantially planar shaft, wherein the shafts of the first and second hooks are in a plane substantially parallel to a plane of the base.

4. The accessory mount of claim 3, wherein at least one of the first or second hooks is configured to establish an electrically conductive pathway between the electronic book reader device and the accessory mount.

5. The accessory mount of claim 1, wherein the first hook comprises a substantially planar shaft, and the second hook comprises a substantially planar shaft, wherein the shafts of the first and second hooks are in a plane substantially parallel to a plane of the base.

6. The accessory mount of claim 1, wherein at least one of the first or second hooks is configured to establish an electrically conductive pathway between the electronic device and the accessory mount.

7. The accessory mount of claim 1, wherein at least one of the first or second hooks conducts electric current between the electronic book reader device and the accessory mount.

8. The accessory mount of claim 1, wherein the accessory mount comprises a cover coupled to the base and configured to cover at least one side of the electronic book reader device when the electronic book reader device is attached via the first hook and the second hook.

9. An accessory mount for an electronic device comprising:
   a base;
   a first hook configured to engage a first slot in an electronic device, the first hook comprising a substantially planar engagement member having a barb and being moveably engaged to the base, a distal end of the first hook pointing substantially toward a first side of the base;
   a spring configured to bias the first hook in a latched configuration; and
   a second hook configured to engage a second slot in the electronic device, the second hook comprising an engagement member having a curve describing an arc in a single plane with a distal end pointing substantially away from the first hook, the second hook being fixed to the base, such that the second hook is substantially immoveable with respect to the base during an engaging of the accessory mount to the electronic book reader device, the distal end pointing substantially toward a second side of the base, the second side being a substantially opposite side of the base from the first side of the base;
   wherein the first hook is moveably engaged to the base such that the first hook is moveable independently from the second hook.

10. The accessory mount of claim 9, wherein a distance between outermost edges of the first hook and the second hook comprises at least 90 mm and at most 150 mm.

11. The accessory mount of claim 10, wherein the first hook comprises a substantially planar shaft, and the second hook comprises a substantially planar shaft, wherein the shafts of the first and second hooks are in a plane substantially parallel to a plane of the base.

12. The accessory mount of claim 11, wherein at least one of the first or second hooks is configured to establish an electrically conductive pathway between the electronic device and the accessory mount.

13. The accessory mount of claim 9, wherein the first hook comprises a substantially planar shaft, and the second hook comprises a substantially planar shaft, wherein the shafts of the first and second hooks are in a plane substantially parallel to a plane of the base.

14. The accessory mount of claim 9, wherein at least one of the first or second hooks is configured to establish an electrically conductive pathway between the electronic device and the accessory mount.

15. The accessory mount of claim 10, wherein at least one of the first or second hooks conducts electric current between the electronic device and the accessory mount.

16. The accessory mount of claim 9, wherein the accessory mount comprises a cover coupled to the base and configured to cover at least one side of the electronic device when the electronic device is attached via the first hook and the second hook.

17. An accessory mount for an electronic device comprising:
   a base;
   a first hook configured to engage a first slot in an electronic device, the first hook comprising a substantially planar engagement member having a barb and being moveably engaged to the base;
   a spring configured to bias the first hook in a latched configuration; and
   a second hook configured to engage a second slot in the electronic device, the second hook comprising an engagement member having a curve describing an arc in a single plane with a distal end pointing substantially away from the first hook, the second hook being fixed to the base, the base having three dimensions and the accessory mount configured to engage with the electronic device by placing the second hook into the second slot and at least moving the electronic device in an arc direction to bring the first slot into engagement with the first hook.

18. The accessory mount of claim 17, wherein a distance between outermost edges of the first hook and the second hook comprises at least 90 mm and at most 150 mm.

19. The accessory mount of claim 18, wherein the first hook comprises a substantially planar shaft, and the second hook comprises a substantially planar shaft, wherein the shafts of the first and second hooks are in a plane substantially parallel to a plane of the base.

20. The accessory mount of claim 19, wherein at least one of the first or second hooks is configured to establish an electrically conductive pathway between the electronic device and the accessory mount.

21. The accessory mount of claim 17, wherein the first hook comprises a substantially planar shaft, and the second hook comprises a substantially planar shaft, wherein the shafts of the first and second hooks are in a plane substantially parallel to a plane of the base.

22. The accessory mount of claim 17, wherein at least one of the first or second hooks is configured to establish an electrically conductive pathway between the electronic device and the accessory mount.

23. The accessory mount of claim 17, wherein at least one of the first or second hooks conducts electric current between the electronic device and the accessory mount.

24. The accessory mount of claim 17, wherein the accessory mount comprises a cover coupled to the base and configured to cover at least one side of the electronic device when the electronic device is attached via the first hook and the second hook.

\* \* \* \* \*